United States Patent
Willcock

(10) Patent No.: US 10,261,691 B2
(45) Date of Patent: *Apr. 16, 2019

(54) COMPUTING REDUCTION AND PREFIX SUM OPERATIONS IN MEMORY

(71) Applicant: Micron Technology, Inc., Boise, ID (US)

(72) Inventor: Jeremiah J. Willcock, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/810,880

(22) Filed: Nov. 13, 2017

(65) Prior Publication Data

US 2018/0067656 A1 Mar. 8, 2018

Related U.S. Application Data

(63) Continuation of application No. 14/874,068, filed on Oct. 2, 2015, now Pat. No. 9,836,218.

(60) Provisional application No. 62/059,256, filed on Oct. 3, 2014.

(51) Int. Cl.
 G09G 5/36 (2006.01)
 G06F 3/06 (2006.01)
 G11C 7/10 (2006.01)

(52) U.S. Cl.
 CPC .......... *G06F 3/0608* (2013.01); *G06F 3/065* (2013.01); *G06F 3/0673* (2013.01); *G11C 7/1006* (2013.01)

(58) Field of Classification Search
 CPC ...... G06F 3/065; G06F 3/0673; G11C 7/1006
 See application file for complete search history.

(56) References Cited

U.S. PATENT DOCUMENTS

| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |

(Continued)

FOREIGN PATENT DOCUMENTS

| CN | 102141905 | 8/2011 |
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

(Continued)

*Primary Examiner* — Ryan Bertram
*Assistant Examiner* — Trang K Ta
(74) *Attorney, Agent, or Firm* — Brooks, Cameron & Huebsch, PLLC

(57) ABSTRACT

The present disclosure includes apparatuses and methods for computing reduction and prefix sum operations in memory. A number of embodiments include processing circuitry configured to compute a reduction operation on data stored in a group of memory cells by splitting the data into a plurality of elements, copying each of the plurality of elements into elements that are wider than before being copied, and performing a logical operation associated with the reduction operation on each of the copied elements.

20 Claims, 8 Drawing Sheets

(56) References Cited

U.S. PATENT DOCUMENTS

| | | | |
|---|---|---|---|
| 4,843,264 | A | 6/1989 | Galbraith |
| 4,939,687 | A | 7/1990 | Hartley et al. |
| 4,958,378 | A | 9/1990 | Bell |
| 4,977,542 | A | 12/1990 | Matsuda et al. |
| 5,023,838 | A | 6/1991 | Herbert |
| 5,034,636 | A | 7/1991 | Reis et al. |
| 5,058,072 | A * | 10/1991 | Kashimura ............ G11C 7/065 365/189.06 |
| 5,121,197 | A | 6/1992 | Yamada et al. |
| 5,201,039 | A | 4/1993 | Sakamura |
| 5,210,850 | A | 5/1993 | Kelly et al. |
| 5,253,308 | A | 10/1993 | Johnson |
| 5,276,643 | A | 1/1994 | Hoffman et al. |
| 5,325,519 | A | 6/1994 | Long et al. |
| 5,367,488 | A | 11/1994 | An |
| 5,379,257 | A | 1/1995 | Matsumura et al. |
| 5,386,379 | A | 1/1995 | Ali-Yahia et al. |
| 5,398,213 | A | 3/1995 | Yeon et al. |
| 5,440,482 | A | 8/1995 | Davis |
| 5,446,690 | A | 8/1995 | Tanaka et al. |
| 5,473,576 | A | 12/1995 | Matsui |
| 5,475,631 | A | 12/1995 | Parkinson et al. |
| 5,481,500 | A | 1/1996 | Reohr et al. |
| 5,485,373 | A | 1/1996 | Davis et al. |
| 5,506,811 | A | 4/1996 | McLaury |
| 5,615,404 | A | 3/1997 | Knoll et al. |
| 5,638,128 | A | 6/1997 | Hoogenboom |
| 5,638,317 | A | 6/1997 | Tran |
| 5,654,936 | A | 8/1997 | Cho |
| 5,678,021 | A | 10/1997 | Pawate et al. |
| 5,724,291 | A | 3/1998 | Matano |
| 5,724,366 | A | 3/1998 | Furutani |
| 5,751,987 | A | 5/1998 | Mahant-Shetti et al. |
| 5,787,458 | A | 7/1998 | Miwa |
| 5,854,636 | A | 12/1998 | Watanabe et al. |
| 5,867,429 | A | 2/1999 | Chen et al. |
| 5,870,504 | A | 2/1999 | Nemoto et al. |
| 5,915,084 | A | 6/1999 | Wendell |
| 5,935,263 | A | 8/1999 | Keeth et al. |
| 5,986,942 | A | 11/1999 | Sugibayashi |
| 5,991,209 | A | 11/1999 | Chow |
| 5,991,785 | A | 11/1999 | Alidina et al. |
| 6,005,799 | A | 12/1999 | Rao |
| 6,009,020 | A | 12/1999 | Nagata |
| 6,092,186 | A | 7/2000 | Betker et al. |
| 6,122,211 | A | 9/2000 | Morgan et al. |
| 6,125,071 | A | 9/2000 | Kohno et al. |
| 6,134,164 | A | 10/2000 | Lattimore et al. |
| 6,147,514 | A | 11/2000 | Shiratake |
| 6,151,244 | A | 11/2000 | Fujino et al. |
| 6,157,578 | A | 12/2000 | Brady |
| 6,163,862 | A | 12/2000 | Adams et al. |
| 6,166,942 | A | 12/2000 | Vo et al. |
| 6,172,918 | B1 | 1/2001 | Hidaka |
| 6,175,514 | B1 | 1/2001 | Henderson |
| 6,181,698 | B1 | 1/2001 | Hariguchi |
| 6,208,544 | B1 | 3/2001 | Beadle et al. |
| 6,226,215 | B1 | 5/2001 | Yoon |
| 6,301,153 | B1 | 10/2001 | Takeuchi et al. |
| 6,301,164 | B1 | 10/2001 | Manning et al. |
| 6,304,477 | B1 | 10/2001 | Naji |
| 6,389,507 | B1 | 5/2002 | Sherman |
| 6,418,498 | B1 | 7/2002 | Martwick |
| 6,466,499 | B1 | 10/2002 | Blodgett |
| 6,510,098 | B1 | 1/2003 | Taylor |
| 6,563,754 | B1 | 5/2003 | Lien et al. |
| 6,578,058 | B1 | 6/2003 | Nygaard |
| 6,731,542 | B1 | 5/2004 | Le et al. |
| 6,754,746 | B1 | 6/2004 | Leung et al. |
| 6,768,679 | B1 | 7/2004 | Le et al. |
| 6,807,614 | B2 | 10/2004 | Chung |
| 6,816,422 | B2 | 11/2004 | Hamade et al. |
| 6,819,612 | B1 | 11/2004 | Achter |
| 6,894,549 | B2 | 5/2005 | Eliason |
| 6,943,579 | B1 | 9/2005 | Hazanchuk et al. |
| 6,948,056 | B1 | 9/2005 | Roth |
| 6,950,771 | B1 | 9/2005 | Fan et al. |
| 6,950,898 | B2 | 9/2005 | Merritt et al. |
| 6,956,770 | B2 | 10/2005 | Khalid et al. |
| 6,961,272 | B2 | 11/2005 | Schreck |
| 6,965,648 | B1 | 11/2005 | Smith et al. |
| 6,985,394 | B2 | 1/2006 | Kim |
| 6,987,693 | B2 | 1/2006 | Cernea et al. |
| 7,020,017 | B2 | 3/2006 | Chen et al. |
| 7,028,170 | B2 | 4/2006 | Saulsbury |
| 7,045,834 | B2 | 5/2006 | Tran et al. |
| 7,054,178 | B1 | 5/2006 | Shiah et al. |
| 7,061,817 | B2 | 6/2006 | Raad et al. |
| 7,079,407 | B1 | 7/2006 | Dimitrelis |
| 7,173,857 | B2 | 2/2007 | Kato et al. |
| 7,187,585 | B2 | 3/2007 | Li et al. |
| 7,196,928 | B2 | 3/2007 | Chen |
| 7,260,565 | B2 | 8/2007 | Lee et al. |
| 7,260,672 | B2 | 8/2007 | Gamey |
| 7,372,715 | B2 | 5/2008 | Han |
| 7,400,532 | B2 | 7/2008 | Aritome |
| 7,406,494 | B2 | 7/2008 | Magee |
| 7,447,720 | B2 | 11/2008 | Beaumont |
| 7,454,451 | B2 | 11/2008 | Beaumont |
| 7,457,181 | B2 | 11/2008 | Lee et al. |
| 7,535,769 | B2 | 5/2009 | Cernea |
| 7,546,438 | B2 | 6/2009 | Chung |
| 7,562,198 | B2 | 7/2009 | Noda et al. |
| 7,574,466 | B2 | 8/2009 | Beaumont |
| 7,602,647 | B2 | 10/2009 | Li et al. |
| 7,663,928 | B2 | 2/2010 | Tsai et al. |
| 7,685,365 | B2 | 3/2010 | Rajwar et al. |
| 7,692,466 | B2 | 4/2010 | Ahmadi |
| 7,752,417 | B2 | 7/2010 | Manczak et al. |
| 7,791,962 | B2 | 9/2010 | Noda et al. |
| 7,796,453 | B2 | 9/2010 | Riho et al. |
| 7,805,587 | B1 | 9/2010 | Van Dyke et al. |
| 7,808,854 | B2 | 10/2010 | Takase |
| 7,827,372 | B2 | 11/2010 | Bink et al. |
| 7,869,273 | B2 | 1/2011 | Lee et al. |
| 7,898,864 | B2 | 3/2011 | Dong |
| 7,924,628 | B2 | 4/2011 | Danon et al. |
| 7,937,535 | B2 | 5/2011 | Ozer et al. |
| 7,957,206 | B2 | 6/2011 | Bauser |
| 7,979,667 | B2 | 7/2011 | Allen et al. |
| 7,996,749 | B2 | 8/2011 | Ding et al. |
| 8,042,082 | B2 | 10/2011 | Solomon |
| 8,045,391 | B2 | 10/2011 | Mohklesi |
| 8,059,438 | B2 | 11/2011 | Chang et al. |
| 8,095,825 | B2 | 1/2012 | Hirotsu et al. |
| 8,117,462 | B2 | 2/2012 | Snapp et al. |
| 8,164,942 | B2 | 4/2012 | Gebara et al. |
| 8,208,328 | B2 | 6/2012 | Hong |
| 8,213,248 | B2 | 7/2012 | Moon et al. |
| 8,223,568 | B2 | 7/2012 | Seo |
| 8,238,173 | B2 | 8/2012 | Akerib et al. |
| 8,274,841 | B2 | 9/2012 | Shinano et al. |
| 8,279,683 | B2 | 10/2012 | Klein |
| 8,310,884 | B2 | 11/2012 | Iwai et al. |
| 8,332,367 | B2 | 12/2012 | Bhattacherjee et al. |
| 8,339,824 | B2 | 12/2012 | Cooke |
| 8,339,883 | B2 | 12/2012 | Yu et al. |
| 8,347,154 | B2 | 1/2013 | Bahali et al. |
| 8,351,292 | B2 | 1/2013 | Matano |
| 8,356,144 | B2 | 1/2013 | Hessel et al. |
| 8,417,921 | B2 | 4/2013 | Gonion et al. |
| 8,462,532 | B1 | 6/2013 | Argyres |
| 8,484,276 | B2 | 7/2013 | Carlson et al. |
| 8,495,438 | B2 | 7/2013 | Roine |
| 8,503,250 | B2 | 8/2013 | Demone |
| 8,526,239 | B2 | 9/2013 | Kim |
| 8,533,245 | B1 | 9/2013 | Cheung |
| 8,555,037 | B2 | 10/2013 | Gonion |
| 8,599,613 | B2 | 12/2013 | Abiko et al. |
| 8,605,015 | B2 | 12/2013 | Guttag et al. |
| 8,625,376 | B2 | 1/2014 | Jung et al. |
| 8,644,101 | B2 | 2/2014 | Jun et al. |
| 8,650,232 | B2 | 2/2014 | Stortz et al. |
| 8,873,272 | B2 | 10/2014 | Lee |

(56) References Cited

U.S. PATENT DOCUMENTS

| | | |
|---|---|---|
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2002/0174158 A1 | 11/2002 | Sutherland et al. |
| 2003/0023646 A1 | 1/2003 | Lin et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Pemer |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2005/0285862 A1* | 12/2005 | Noda ............... G11C 7/1006 345/502 |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0164972 A1* | 7/2010 | Akerib ............... G09G 5/06 345/560 |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0141830 A1* | 6/2011 | Chi ............... G11C 7/065 365/189.11 |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0207170 A1* | 8/2013 | Kurokawa ....... H03K 19/17728 257/296 |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0016420 A1* | 1/2014 | Jeong ............... G11C 7/06 365/207 |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 Minloc and Maxloc", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

(56) References Cited

OTHER PUBLICATIONS

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory As a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

\* cited by examiner

| 615 | 618 | 624 | 625 | 626 |
|---|---|---|---|---|
| A | B | NOT OPEN | OPEN TRUE | OPEN INVERT |
| 0 | 0 | 0 | 0 | 1 |
| 0 | 1 | 0 | 1 | 0 |
| 1 | 0 | 1 | 0 | 1 |
| 1 | 1 | 1 | 1 | 0 |

601-1

627 (crossover between rows)

| | FF | 0 | 0 | 0 | 0 | 0 | 0 | 1 | 1 | 1 | ← 628 |
| | FT | 0 | 0 | 0 | 1 | 1 | 1 | 0 | 0 | 0 | ← 629 |
| | TF | 0 | 0 | 1 | 0 | 0 | 1 | 0 | 0 | 1 | ← 632 |
| | TT | 0 | 1 | 0 | 0 | 1 | 0 | 0 | 1 | 0 | ← 633 |
| A | B | A | A*B | A*B̄ | A+B | B | AXB | A+B̄ | $\overline{AXB}$ | B̄ | ← 634 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

COMPUTING REDUCTION AND PREFIX SUM OPERATIONS IN MEMORY

PRIORITY INFORMATION

This application is a Continuation of U.S. application Ser. No. 14/874,068, filed Oct. 2, 2015, which claims the benefit of U.S. Provisional Application No. 62/059,256, filed Oct. 3, 2014, the contents of which are incorporated herein by reference.

TECHNICAL FIELD

The present disclosure relates generally to semiconductor memory apparatuses and methods, and more particularly, to apparatuses and methods for computing reduction and prefix sum operations in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry (FUC) may be used to perform arithmetic operations such as addition, subtraction, multiplication, and/or division on operands via a number of logical operations.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed via a bus between the processing resources and the memory array to execute instructions. Processing performance may be improved in a processor-in-memory (PIM) device, in which a processor may be implemented internal and/or near to a memory (e.g., directly on a same chip as the memory array), which may conserve time and power in processing. However, such PIM devices may still have various drawbacks. For example, such PIM devices may have a limited topology, which can make it difficult to shift (e.g., move) data in the memory. For instance, such PIM devices may only be able to shift bits of data one place at a time. As such, performing logical operations that involve a large amount of data shifting, such as, for instance, reduction and prefix sum operations, using such PIM devices can be a slow process.

BRIEF DESCRIPTION OF THE DRAWINGS

FIG. 6B is a logic table illustrating selectable logic operation results implemented by processing circuitry in accordance with a number of embodiments of the present disclosure.

DETAILED DESCRIPTION

Figure 1:
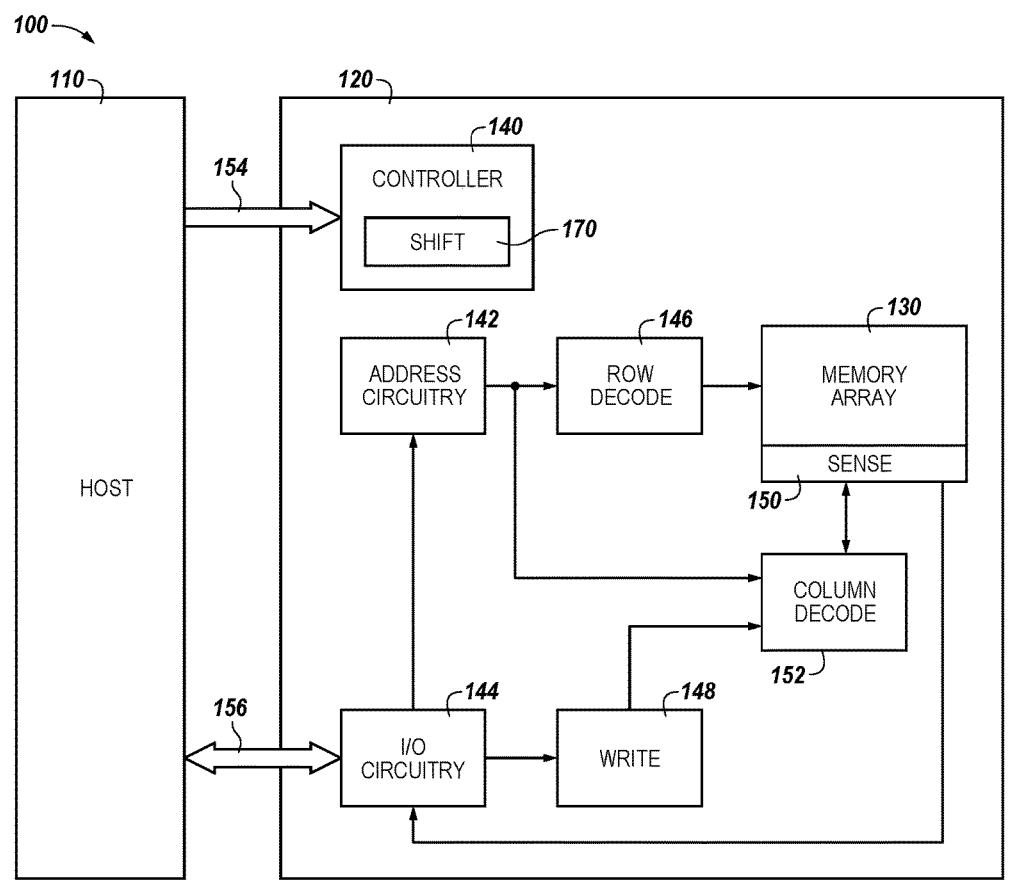
FIG. 1 is a block diagram of an apparatus in the form of a computing system including a memory device in accordance with a number of embodiments of the present disclosure.

The present disclosure includes apparatuses and methods for computing reduction and prefix sum operations in memory. A number of embodiments include processing circuitry configured to compute a reduction operation on data stored in a group of memory cells by splitting the data into a plurality of elements, copying each of the plurality of elements into elements that are wider than before being copied, and performing a logical operation associated with the reduction operation on each of the copied elements.

A number of embodiments of the present disclosure can provide faster computations of reduction and prefix sum operations in memory than previous approaches. For example, a number of embodiments of the present disclosure can use fewer data shifts to compute reduction and prefix sum operations than previous approaches, which can reduce the amount of time needed to compute the reduction and prefix sum operations as compared with previous approaches. For instance, in some previous approaches, reduction and prefix sum operations may be computed by shifting data in one direction (e.g., to the right) by increasing powers of two (e.g., shift the data to the right by one element and perform an addition operation, then shift the data to the right by two elements and perform an addition operation, then shift the data to the right by four elements and perform an addition operation, etc.), which can involve a larger number of data shifts, and therefore take longer, than reduction and prefix sum operations computed in accordance with embodiments of the present disclosure.

Further, in previous approaches, data may be transferred from and/or to the array and sensing circuitry (e.g., via a bus comprising input/output (I/O) lines) to and/or from a processing resource such as a processor, microprocessor, and/or compute engine, which may comprise ALU circuitry and/or other functional unit circuitry configured to perform the appropriate logical operations. However, transferring data to and/or from memory from and/or to such processing resource(s) can involve significant power consumption and time requirements. Even if the processing resource is located on the same chip as the array, significant power can be consumed in moving data out of the array to the compute circuitry (e.g., ALU), which can involve performing a sense line address access (e.g., firing of a column decode signal) in order to transfer data from sense lines onto I/O lines, moving the data to the array periphery, and providing the data to a register in association with performing a comparison operation, for instance.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with memory cells of the array and capable of performing operations such as those described herein below to compute reduction and prefix sum operations.

As used herein, the designators "X" and "Y", particularly with respect to reference numerals in the drawings, indicate that a number of the particular feature so designated can be included with a number of embodiments of the present disclosure. Additionally, as used herein, "a number of" something can refer to one or more of such things. For example, a number of memory cells can refer to one or more memory cells.

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

In the example illustrated in FIG. 1, system 100 includes a host 110 coupled (e.g. connected) to memory device 120, which includes a memory array 130. Host 110 can be a host system such as a personal laptop computer, a desktop computer, a digital camera, a mobile (e.g., smart) phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a von Neumann architecture, embodiments of the present disclosure can be implemented in non-von Neumann architectures (e.g., a Turing machine), which may not include one or more components (e.g., CPU, ALU, etc.) often associated with a von Neumann architecture.

Although system 100 includes a host (e.g., host 110) in the example illustrated in FIG. 1, embodiments of the present disclosure are not so limited. For example, in a number of embodiments, system 100 may not include a host.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be sensed (e.g., read) from memory array 130 by sensing voltage and/or current changes on the data lines using processing circuitry, such as sensing circuitry 150, controller 140, address circuitry 142, row decoder 146, and/or column decoder 152. The sensing circuitry 150 can read and latch a page (e.g., row) of data from the memory array 130. The I/O circuitry 144 can be used for bi-directional data communication with host 110 over the I/O bus 156. The write circuitry 148 is used to program (e.g., write) data to the memory array 130.

Control circuitry (e.g., controller) 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

The controller 140 can include a shift controller 170 that can control signals provided to, for instance, shift circuitry (e.g., shift circuitry 223 described in connection with FIG. 2) in association with performing data shifting as described further herein. For example, data in an array (e.g., array 130) can be shifted (e.g., right or left) via (e.g., through) the shift circuitry during a reduction or prefix sum operation, as will be further described herein.

Examples of the sensing circuitry 150 are described further below in association with FIGS. 2 and 3. For instance, in a number of embodiments, the sensing circuitry 150 can comprise a number of sense amplifiers (e.g., sense amplifiers 206 shown in FIG. 2 and/or sense amplifier 306 shown in FIG. 3) and a number of compute components (e.g., compute components 231 shown in FIG. 2 and/or compute component 331 shown in FIG. 3), which may comprise an accumulator and can be used to perform logical operations (e.g., on data associated with complementary sense lines).

In a number of embodiments, the sensing circuitry (e.g., 150) can be used to compute reduction and/or prefix sum operations on data stored in array 130 without performing (e.g., transferring data via) a sense line address access (e.g., without firing a column decode signal). As such, a reduction and/or prefix sum operation can be computed using, and within, sensing circuitry 150 rather than (or in association with) being computed by processing resources external to the sensing circuitry 150 (e.g., by a processor associated with host 110 and/or other processing circuitry, such as ALU circuitry, located on device 120 (e.g., on control circuitry 140 or elsewhere)). However, embodiments of the present disclosure are not so limited. For example, in a number of embodiments, reduction and/or prefix sum operations in accordance with the present disclosure can be computed by processing resources (e.g., processing circuitry) external to sensing circuitry 150. For instance, reduction and/or prefix sum operations in accordance with the present disclosure can be computed by an array of processors, such as bit-serial processors or nibble-serial processors, among others, connected in a linear or other type of connection topology. A prefix sum operation can refer to an operation that computes all the partial sums of an array of numbers (e.g., that computes sums over all prefixes of the array), and can include, for example, a segmented prefix sum operation. A reduction operation can refer to an operation that reduces an input array to a single element, which is the sum of all the elements in the input array. In some instances, a reduction operation can be a part of a prefix sum operation. Examples of reduction and prefix sum operations will be further described herein.

In various previous approaches, data associated with a reduction or prefix sum operation (e.g., the data on which the reduction or prefix sum operation is to be computed), for instance, would be read from memory via sensing circuitry and provided to external ALU circuitry via I/O lines (e.g., via local and/or global I/O lines) and/or busses. The external ALU circuitry could include a number of registers, and would perform the computation and transfer the result back to the array via the local I/O lines and/or busses. In contrast, in a number of embodiments of the present disclosure, sensing circuitry (e.g., 150) is configured to compute a reduction and/or prefix sum operation on data stored in memory cells in memory array 130, including storing the result of the computation back to the array 130, without transferring the data via (e.g., enabling) a local I/O line and/or bus coupled to the sensing circuitry, which can be formed on pitch with the memory cells of the array. Enabling an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to compute reduction and/or prefix sum operations without enabling column decode lines of the array; however, the local I/O line(s) may be enabled in order to transfer a result to a suitable location other than back to the array (e.g., to an external register and/or external hardware).

As such, in a number of embodiments, circuitry (e.g., registers and/or an ALU) external to array 130 and sensing circuitry 150 may not be needed to compute reduction and/or prefix sum operations, as the sensing circuitry 150 can perform the appropriate computations and logical operations without the use of an external processing resource. Therefore, the sensing circuitry 150 may be used to complement and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
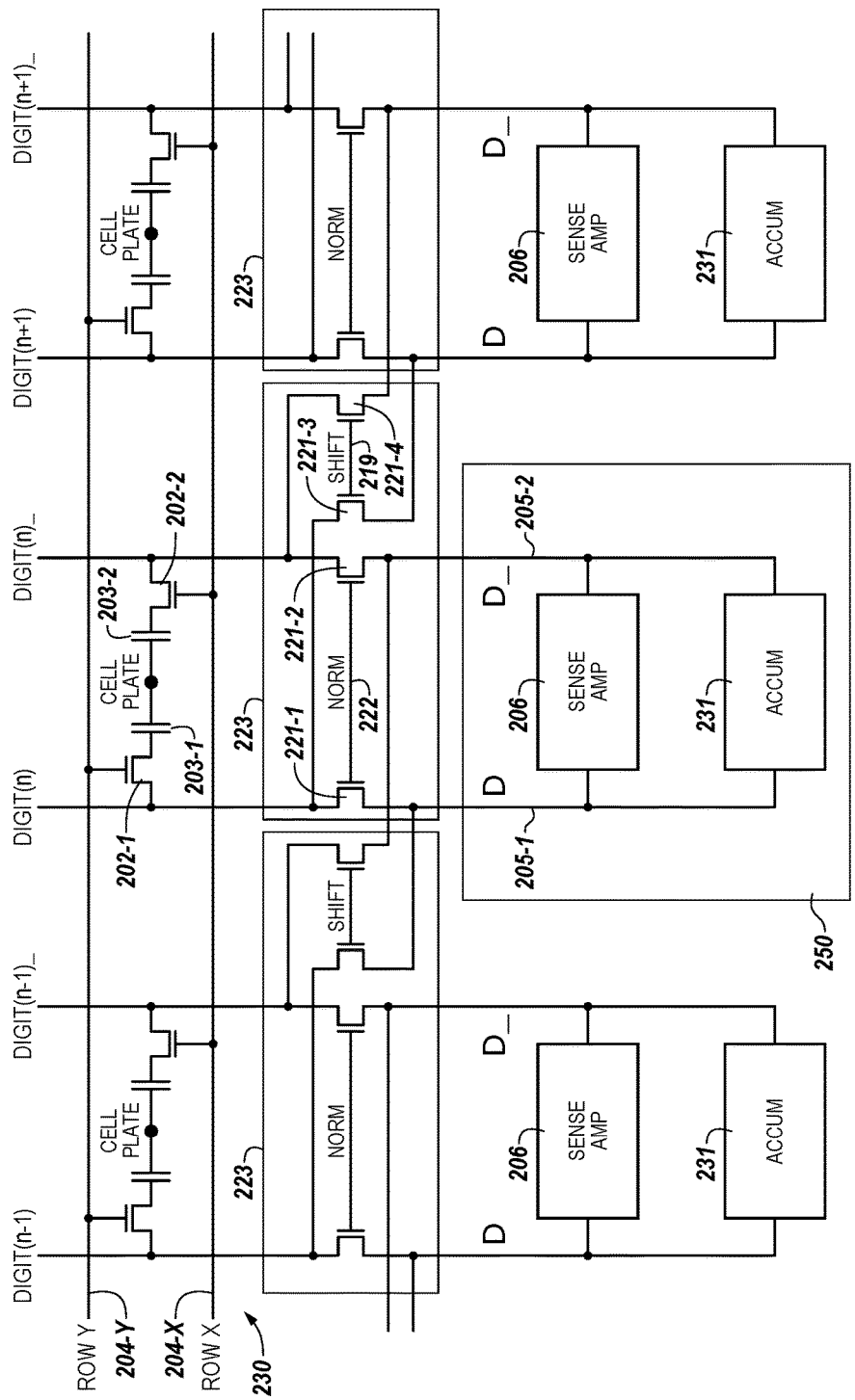
FIG. 2 is a schematic diagram illustrating a portion of a memory array coupled to processing circuitry in accordance with a number of embodiments of the present disclosure.

FIG. 2 is a schematic diagram illustrating a portion of a memory array 230 coupled to processing (e.g., sensing) circuitry 250 in accordance with a number of embodiments of the present disclosure. Memory array 230 and sensing circuitry 250 can be, for example, memory array 130 and sensing circuitry 150, respectively, previously described in connection with FIG. 1. As shown in FIG. 2, sensing circuitry 250 can include a sense amplifier 206 and a compute component (e.g., accumulator) 231. Sensing circuitry 250 will be further described herein (e.g., in connection with FIG. 3).

In the example illustrated in FIG. 2, the memory array 230 is a DRAM array of 1T1C (one transistor one capacitor) memory cells each comprised of an access device 202-1, 202-2 (e.g., transistor) and a storage element 203-1, 203-2 (e.g., a capacitor). However, embodiments of the present disclosure are not so limited. For example, in a number of embodiments, memory array 230 can be an array of 2T2C memory cells.

In a number of embodiments, the memory cells of array 230 may be destructive read memory cells (e.g., reading the data stored in the cell destroys the data such that the data originally stored in the cell is refreshed after being read). The cells of the memory array 230 are arranged in rows coupled by word lines (e.g., 204-X (Row X), 204-Y (Row Y)) and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pairs of complementary data lines are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, as shown in FIG. 2, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2A, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. For example, the sensing circuitry 250 can be coupled to the array of memory cells by one or more data lines (e.g., complementary data lines D and D_) through shift circuitry 223. As such, the sensing circuitry can be configured and/or operated to shift data stored in a memory cell coupled to a first data line to a memory cell coupled to a second data line via (e.g., through) shift circuitry 223.

The sensing circuitry 250, including the sense amplifier 206 and the compute component 231, can be coupled to the array 230 via the shift circuitry 223. The shift circuitry 223 can include a pair of isolation transistors 221-1 and 221-2 having gates coupled to a first control signal 222 (e.g., NORM) that, when activated, enables (e.g., turns on) the isolation transistors 221-1 and 221-2 to connect the sensing circuitry 250 (e.g., sense amplifier 206 and the compute component 231) to a column of memory cells with which the sensing circuitry 250 is associated. According to various embodiments, conduction of isolation transistors 221-1 and 221-2 can be referred to as a "normal" configuration.

As illustrated in FIG. 2, the shift circuitry 223 can also include another pair of isolation transistors 221-3 and 221-4 having gates coupled to a second control signal 219 (e.g., SHIFT), which may be activated when NORM is deactivated, for example. The isolation transistors 221-3 and 221-4 can be arranged such that the sensing circuitry 250 is coupled to a different set of complementary data lines than the complementary data lines to which isolation transistors 221-1 and 221-2 connect sense amplifier 206 and compute component 231. For example, enabling isolation transistors 221-3 and 221-4 can connect the sensing circuitry 250 to an adjacent pair of complementary data lines (e.g., to the right), as shown in FIG. 2.

Although shift circuitry 223 is shown in FIG. 2 having isolation transistors 221-1 and 221-2 coupled to one set of complementary data lines (e.g., DIGIT(n) and DIGIT(n)_ and isolation transistors 221-3 and 221-4 arranged so as to be coupled to adjacent data lines in one particular direction (e.g., data lines DIGIT(n+1) and DIGIT(n+1)_ shown to the right in FIG. 2), embodiments of the present disclosure are not so limited, and shift circuitry can include, for example, isolation transistors 221-1 and 221-2 coupled to one set of complementary data lines (e.g., DIGIT(n) and DIGIT(n)_ and isolation transistors 221-3 and 221-4 arranged so as to be coupled to adjacent data lines in another particular direction (e.g., data lines DIGIT(n−1) and DIGIT(n−1)_ shown to the left in FIG. 2). Various embodiments can include all isolation transistors in a single shift circuitry 223, or other configurations of isolation transistors 221-1, 221-2, 221-3, and/or 221-4 in shift circuitry 223.

According to some embodiments, shift circuitry 223 can be configured to connect the sensing circuitry 250 to a non-adjacent pair of complementary data lines. According to various embodiments, shift circuitry 223 can be configured to connect the sensing circuitry 250 to a pair of complementary data lines from among a plurality of pairs of complementary data lines (e.g., selected from among adjacent pairs of complementary data lines to the left and right of the pair of complementary data lines to which isolation transistors 221-1 and 221-2 are coupled).

Figure 3:
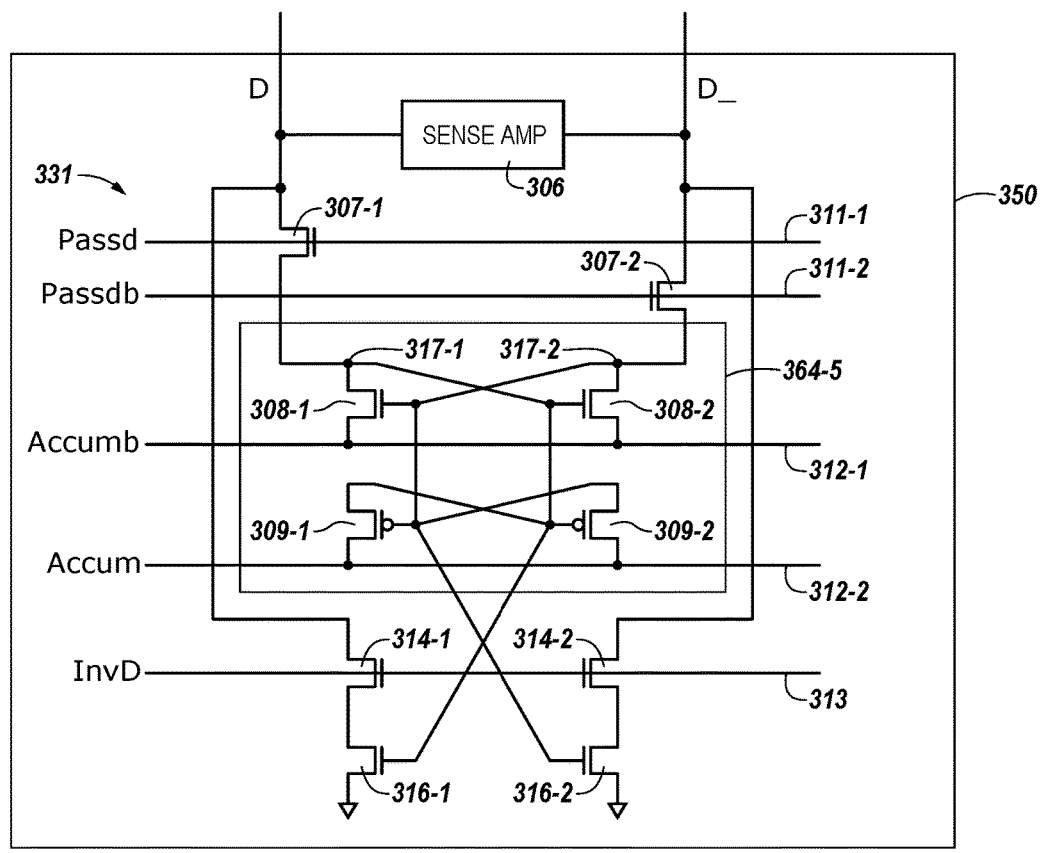
FIG. 3 is a schematic diagram illustrating processing circuitry in accordance with a number of embodiments of the present disclosure.

FIG. 3 is a schematic diagram illustrating processing (e.g., sensing) circuitry 350 in accordance with a number of embodiments of the present disclosure. Sensing circuitry 350 can be, for example, sensing circuitry 150 and/or 250 previously described in connection with FIGS. 1 and 2, respectively.

In the example illustrated in FIG. 3, sensing circuitry 350 comprises a sense amplifier 306 and a compute component 331 corresponding to respective columns of memory cells (e.g., coupled to respective pairs of complementary data lines). As further described below, in a number of embodiments, sensing circuitry 350 (e.g., sense amplifier 306 and compute component 331) can compute reduction and/or prefix sum operations without transferring data from the sensing circuitry via an I/O line or bus (e.g., without performing a data line address access via activation of a column decode signal) to an external control component.

The sense amplifier 306 can be operated to determine a data value (e.g., logic state) stored in a selected memory cell. The sense amplifier 306 can comprise a cross coupled latch, which can be referred to herein as a primary latch. Embodiments are not limited to the example sense amplifier 306. As an example, the sense amplifier 306 can be current-mode sense amplifier and/or single-ended sense amplifier (e.g., sense amplifier coupled to one data line). Also, embodiments of the present disclosure are not limited to a folded data line architecture.

According to various embodiments, the compute component 331 can comprise a latch, which can be referred to herein as a secondary latch, and which can serve as, and be referred to as, an accumulator. The secondary latch can be a static latch, such as a cross coupled latch, and/or a dynamic latch.

In the example illustrated in FIG. 3, the compute component 331 includes eight transistors (e.g., four transistors per complementary data line). The transistors are formed on pitch with the sense amplifier 306 and with the memory cells of the array (e.g., array 130 and/or 230). The compute component 331 is coupled to the sense amplifier 306 via the data lines D and D_ (e.g., data lines 205-1 and 205-2) as shown in FIG. 3. In this example, the transistors of compute component 331 are n-channel transistors (e.g., NMOS transistors) and p-channel transistors (e.g., PMOS transistors); however, embodiments are not so limited.

In the example illustrated in FIG. 3, the circuitry corresponding to compute component 331 comprises five transistors coupled to each of the data lines D and D_. However, embodiments are not limited to this example. Transistors 307-1 and 307-2 have a first source/drain region coupled to data lines D and D_, respectively, and a second source/drain region coupled to a cross coupled latch (e.g., coupled to gates of a pair of cross coupled transistors, such as cross coupled NMOS transistors 308-1 and 308-2 and cross coupled PMOS transistors 309-1 and 309-2). The cross coupled latch comprising transistors 308-1, 308-2, 309-1, and 309-2 can be referred to as a secondary latch, which can be referred to as the accumulator of compute component 331.

The transistors 307-1 and 307-2 can be referred to as pass transistors, which can be enabled via respective signals 311-1 (Passd) and 311-2 (Passdb) in order to pass the voltages or currents on the respective data lines D and D_ to the inputs of the cross coupled latch comprising transistors 308-1, 308-2, 309-1, and 309-2 (e.g., the input of the secondary latch). In this example, the second source/drain region of transistor 307-1 is directly coupled to a first source/drain region of transistors 308-1 and 309-1 as well as to the gates of transistors 308-2 and 309-2. Similarly, the second source/drain region of transistor 307-2 is directly coupled to a first source/drain region of transistors 308-2 and 309-2 as well as to the gates of transistors 308-1 and 309-1.

A second source/drain region of transistor 308-1 and 308-2 is commonly directly coupled to a negative control signal 312-1 (Accumb). A second source/drain region of transistors 309-1 and 309-2 both share a common connection direct to a positive control signal 312-2 (Accum). The Accum signal 312-2 can be a supply voltage (e.g., $V_{DD}$) and the Accumb signal can be a reference voltage (e.g., ground). Activating signals 312-1 and 312-2 enables the cross coupled latch comprising transistors 308-1, 308-2, 309-1, and 309-2 corresponding to the secondary latch.

The enabled sense amplifier pair can operate to amplify a differential voltage between common node 317-1 and common node 317-2 such that node 317-1 is driven to one of the Accum signal voltage and the Accumb signal voltage (e.g., to one of $V_{DD}$ and ground), and node 317-2 is driven to the other of the Accum signal voltage and the Accumb signal voltage.

The compute component 331 also includes inverting transistors 314-1 and 314-2 having a first source/drain region directly coupled to the respective data lines D and D_. A second source/drain region of the transistors 314-1 and 314-2 is directly coupled to a first source/drain region of pull-down transistors 316-1 and 316-2, respectively. The gates of transistors 314-1 and 314-2 are coupled to a signal 313 (InvD). The gate of transistor 316-1 is coupled to the common node 317-1 to which the gate of transistor 308-2, the gate of transistor 309-2, and the first source/drain region of transistor 308-1 are also directly coupled. In a complementary fashion, the gate of transistor 316-2 is directly coupled to the common node 317-2 to which the gate of transistor 308-1, the gate of transistor 309-1, and the first source/drain region of transistor 308-2 are also directly coupled. As such, activating signal InvD serves to invert the data value stored in the secondary latch and drives the inverted value onto data lines 305-1 D and D_.

Sensing circuitry 350 (e.g., sense amplifier 306 and compute component 331) can be used to compute reduction and prefix sum operations on data stored in the memory cells (e.g., in a group of the memory cells) of arrays 130 and/or 230. For example, sensing circuitry 350 can be used to compute a reduction operation on the data stored in a group of the memory cells by sensing the data stored in the group of memory cells and splitting the data (e.g., vector) into a plurality of elements (e.g., blocks) by, for example, taking every nth bit of data for some n greater than or equal to two. For example, the data can be split into even and odd indexed elements. The group of memory cells may be coupled to a single (e.g., only one) sense line, or to a plurality of sense lines. For example, the data may include data stored in a single column of memory cells, or data stored in a plurality of columns of memory cells. Further, the group of memory cells may be coupled to a plurality of access lines. For example, the data may include data stored in a plurality of rows of memory cells. Sensing circuitry 350 may split the data using shift circuitry 223 previously described in connection with FIG. 2.

Sensing circuitry 350 (e.g., via shift circuitry 223) can then copy each of the plurality of elements (e.g., the even indexed elements and the odd indexed elements) into elements that are twice as wide and half as tall than before being copied. For example, the even indexed elements can be copied to memory cells coupled to twice as many sense lines and half as many access lines, and the odd indexed elements can be copied to memory cells coupled to twice as many sense lines and half as many access lines. Accordingly, the data of the elements may be copied into double the number of columns and half the number of rows. The elements can be copied (e.g., programmed) to the same group of memory cells, an additional (e.g., different) group of memory cells, or a partially overlapping group of memory cells. Moreover, the elements can be copied to the same part of the memory array, a different part of the memory array, or a partially overlapping part of the memory array.

Sensing circuitry 350 can then perform a logical operation associated with the reduction operation on each of the copied elements (e.g., on the copied even indexed elements and the copied odd indexed elements) to combine the copied elements (e.g., to recombine the even and odd indexed elements into a single vector). The logical operation associated with the reduction operation can be, for example, the underlying operation of the reduction operation. For instance, if the reduction operation is an addition operation, the logical operation can be an addition operation, and if the reduction operation is a multiplication operation, the logical operation can be a multiplication operation. The reduction operation (e.g., the logical operation) can also be a minimum or maximum location operation, an OR operation, an AND operation, or an XOR operation, among others. The operation may apply to corresponding elements in a plurality of vectors (e.g., the operation may combine the first element of each vector, the second element of each vector, etc.)

In some embodiments, sensing circuitry 350 can output the result of the reduction operation to external hardware. An example of a computation of a reduction operation will be described in connection with FIG. 4.

As an additional example, sensing circuitry 350 can compute a prefix sum operation on the data stored in a group of the memory cells by sensing the data stored in the group of memory cells and splitting the data into a plurality of elements in a manner analogous to the reduction operation. Sensing circuitry 350 can then copy each of the plurality of elements into elements twice as wide and half as tall, in a manner analogous to the reduction operation. Sensing circuitry 350 can then perform a logical operation (e.g., addition) associated with the prefix sum operation on the copied elements to combine the copied elements. The operation may apply to corresponding elements in a plurality of vectors, in a manner analogous to the reduction operation.

The logical operation can be performed using, for example, algorithms based on the structure of an adder such as a Kogge-Stone adder or a Brent-Kung adder, or a recursive call to one of the prefix sum algorithms described herein. Further, the prefix sum operation can be computed using an identity element, or without using an identity element.

As an example in which the prefix sum operation is computed using an identity element, sensing circuitry 350 can shift (e.g., via shift circuitry 223) the output of the logical operation by one element, and fill in the identity element in the element of the output of the logical operation that is empty as a result of the shift. The direction the output of the logical operation is shifted may be based on the direction of the prefix sum operation. For example, if the prefix sum operation is a forward prefix sum operation, the output of the logical operation may be shifted right by one element, and the identity element may be filled in the left-most (e.g., first) element of the output. If the prefix sum operation is a backward prefix sum operation, the output of the logical operation may be shifted left by one element, and the identity element may be filled in the right-most (e.g., last) element of the output.

Sensing circuitry 350 can then perform another logical operation (e.g., addition) on the shifted output and one of the previously copied elements (e.g., the even indexed elements) to combine the shifted output and the one of the copied elements, and pack the output of this logical operation (e.g., the combined shifted output and copied even indexed elements) into elements half as wide and twice as tall as before the logical operation. An example of such a computation of a prefix sum operation will be described in connection with FIGS. 5A-5B. Further, in such a computation (e.g., a computation that uses the previously copied even indexed elements), the prefix sum operation is a forward prefix sum operation. However, embodiments of the present disclosure are not so limited, and can include computations of backward prefix sum operations. Such a computation would use the previously copied odd indexed elements in place of the previously copied even indexed elements. For example, computing a backward prefix sum operation would be similar to computing a forward prefix sum operation, except the sequence before and after the logical operation would be treated as reversed.

As an example in which the prefix sum operation is computed without using an identity element, sensing circuitry 350 can shift (e.g., via shift circuitry 223) the output of the logical operation by one element, and fill in an arbitrary value in the element of the output of the logical operation that is empty as a result of the shift. The direction the output of the logical operation is shifted may be based on the direction of the prefix sum operation, in a manner analogous to that previously described in the example in which the prefix sum operation is computed using an identity element.

Sensing circuitry 350 can then perform another logical operation (e.g., addition) on the shifted output and one of the previously copied elements (e.g., the even indexed elements) to combine the shifted output and the one of the copied elements, and store the output of this logical operation (e.g., the combined shifted output and copied even indexed elements) in a temporary vector T. The left-most (e.g., first) element of temporary vector T can then be replaced with the first element of the previously copied even indexed elements. This can be done by, for example, an if-then-else operation, hardware multiplexor, masked vector operations, a vector merge operation, or any other process capable of performing such a replacement operation. The output of this replacement operation can then be packed into elements half as wide as twice as tall as before the logical operation.

Although embodiments of the present disclosure have described copying blocks of data into elements twice as wide and half as tall, embodiments of the present disclosure are not limited to a particular fraction into which the blocks of data may be copied. For example, embodiments of the present disclosure may include copying blocks of data into other fractional elements. For example, vertical operations can be performed on the blocks of data until the data has been spread out sufficiently for horizontal operations to be performed on the data. Upon the data being spread out sufficiently for horizontal operations to be performed, the data can be gathered into a single row, and a horizontal reduction or prefix sum operation can be computed on the single row of data. As such, instead of performing block packing operations iteratively, the block packing operations can be saved up and performed at once after the data has been spread out sufficiently. As an example, for 16-bit data, the data may be converted to a horizontal format only once, with only every 16th element used for the rest of the computation operation. The result of the horizontal reduction or prefix sum operation can then be converted back directly into vertical 16-bit elements later in the computing operation.

Figure 4:
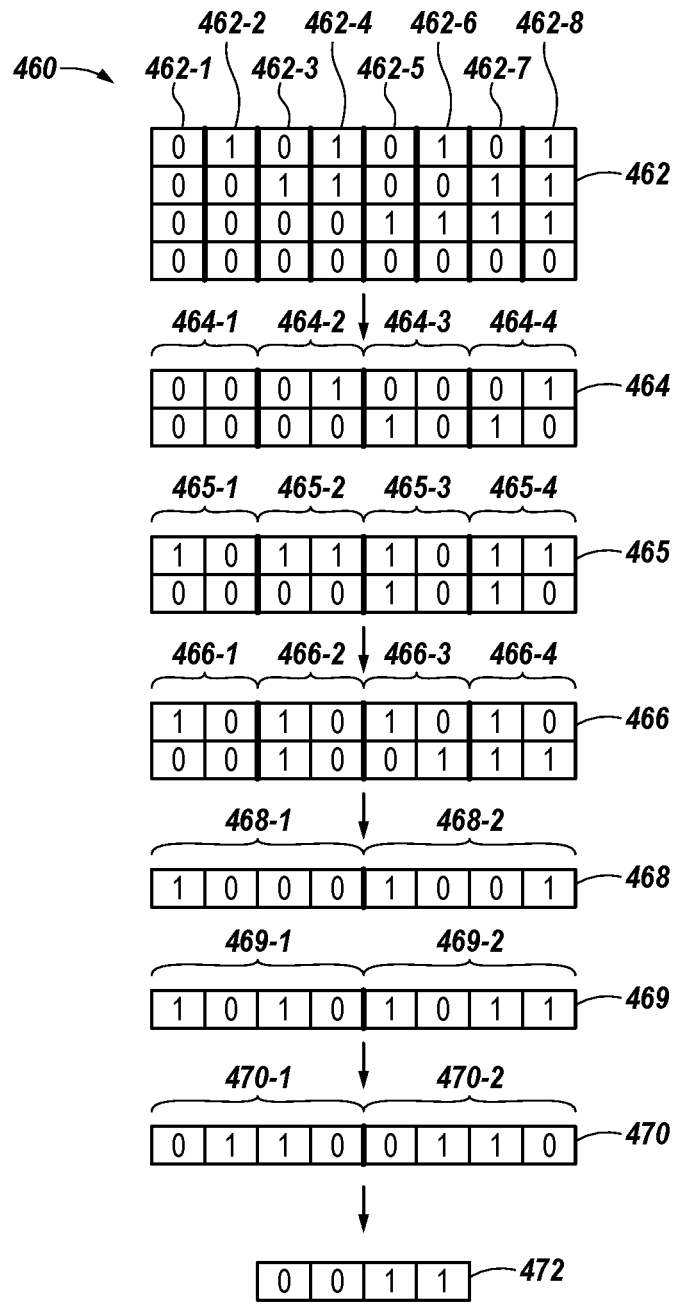
FIG. 4 illustrates an example of a reduction operation computed in accordance with a number of embodiments of the present disclosure.

FIG. 4 illustrates an example of a reduction operation 460 computed in accordance with a number of embodiments of the present disclosure. The reduction operation 460 illustrated in FIG. 4 can be computed by sensing circuitry 350 (e.g., sense amplifier 306 and compute component 331) previously described in connection with FIG. 3. The reduction operation 460 illustrated in FIG. 4 can be an addition operation. However, embodiments of the present disclosure are not limited to such an example. The example illustrated in FIG. 4 lays out data least-significant-bit (LSB) to most-significant-bit (MSB) in normal reading order (e.g., left-to-right, then top-to-bottom). Further, the indexing illustrated in FIG. 4 is one-based.

Reduction operation 460 can be computed on data 462 illustrated in FIG. 4. Data 462 can be data stored in a group of memory cells of memory arrays 130 and/or 230 previously described in connection with FIGS. 1 and 2, respectively. The group of memory cells may be coupled to eight sense lines and four access lines (e.g., the group may include eight columns and four rows of memory cells). For example, data 462 can be data stored in eight columns and four rows of memory cells, as illustrated in FIG. 4. Each column (e.g., each four by one block 462-1, 462-2, . . . , 462-8) of data 462 can correspond to a decimal numeral. For example, the first column (e.g., block 462-1) of data 462 (e.g., 0000) can correspond to decimal numeral 0, the second column (e.g., block 462-2) of data 462 (e.g., 1000) can correspond to decimal numeral 1, the third column (e.g., block 462-3 of data 462 (e.g., 0100) can correspond to decimal numeral 2, the fourth column (e.g., block 462-3) of data 462 (e.g., 1100) can correspond to decimal numeral 3, etc.

As shown in FIG. 4, reduction operation 460 can include splitting data 462 into even indexed elements 464 and odd indexed elements 465, and copying even and odd indexed elements 464 and 465 into two by two elements (e.g, blocks) 464-1, . . . , 464-4 and 465-1, . . . 465-4, respectively. An example of code (e.g., pseudocode representing executable instructions) for performing such an operation will be further described herein. In the example illustrated in FIG. 4, block 464-1 of even indexed elements 464 (e.g., 0000) can correspond to decimal numeral 0, block 464-2 of even indexed elements 464 (e.g., 0100) can correspond to decimal numeral 2, block 464-3 of even indexed elements 464 (e.g., 0010) can correspond to decimal numeral 4, and block 464-4 of even indexed elements 464 (e.g., 0110) can correspond to decimal numeral 6. Similarly, blocks 465-1, 465-2, 465-3, and 465-4 of odd indexed elements 465 (e.g., 1000, 1100, 1010, and 1110, respectively), can correspond to decimal numerals 1, 3, 5, and 7, respectively.

As shown in FIG. 4, reduction operation 460 can include performing an addition operation on the corresponding two by two blocks of even indexed elements 464 and odd indexed elements 465 to obtain data 466. For example, block 464-1 of even indexed elements 464 (e.g., 0000) and block 465-1 of odd indexed elements 465 (e.g., 1000) can be added (e.g., combined) to obtain block 466-1 of data 466 (e.g., 1000, which corresponds to decimal numeral 1). Similarly, blocks 464-2 and 465-2 of even indexed elements 464 and odd indexed elements 465, respectively (e.g., 0100 and 1100, respectively) can be added (e.g. combined) to obtain block 466-2 of data 466 (e.g., 1010, which corresponds to decimal numeral 5), blocks 464-3 and 465-3 of even indexed elements 464 and odd indexed elements 465, respectively (e.g., 0010 and 1010, respectively) can be added to obtain block 466-3 of data 466 (e.g., 1001, which corresponds to decimal numeral 9), and blocks 464-4 and 465-4 of even indexed elements 464 and odd indexed elements 465, respectively (e.g., 0110 and 1110, respectively) can be added to obtain block 466-4 of data 466 (e.g., 1011, which corresponds to decimal numeral 13). As such, data 466 can be stored in eight columns and two rows of memory cells, as illustrated in FIG. 4. An example of code (e.g., pseudocode) for performing such an addition operation will be further described herein.

As shown in FIG. 4, reduction operation 460 can include splitting data 466 into even indexed elements 468 and odd indexed elements 469, and copying even and odd indexed elements 468 and 469 into one by four blocks 468-1 and 468-2, and 469-1 469-2, respectively. An example of code for performing such an operation will be further described herein. Blocks 468-1 and 468-2 of even indexed elements 468 can correspond to the decimal numerals of blocks 466-1 and 466-3 of data 466, and blocks 469-1 and 469-2 of odd indexed elements 469 can correspond to the decimal numerals of blocks 466-2 and 466-4 of data 466. For example, block 468-1 of even indexed element 468 (e.g., 1000) can correspond to decimal numeral 1, and block 468-2 of even indexed element 468 (e.g., 1001) can correspond to decimal numeral 9. Similarly, blocks 469-1 and 469-2 of odd indexed element 469 (e.g., 1010 and 1011, respectively) can correspond to decimal numerals 5 and 13, respectively.

As shown in FIG. 4, reduction operation 460 can include performing an addition operation on the corresponding one by four blocks of even indexed elements 468 and odd indexed elements 469 to obtain data 470. For example, block 468-1 of even indexed elements 468 (e.g., 1000) and block 469-1 of odd indexed elements 469 (e.g., 1010) can be added (e.g., combined) to obtain block 470-1 of data 470 (e.g., 0110, which corresponds to decimal numeral 6). Similarly, blocks 468-2 and 469-2 of even indexed elements 468 and odd indexed elements 469, respectively, (e.g., 1001 and 1011, respectively) can be added (e.g., combined) to obtain block 470-2 of data 470 (e.g., 0110, which corresponds to decimal numeral 6, as the addition is modulo 16 because the blocks are four bits). As such, data 470 can be stored in eight columns and one row of memory cells, as illustrated in FIG. 4. An example of code for performing such an addition operation will be further described herein.

As shown in FIG. 4, reduction operation 460 can include computing an addition operation on blocks 470-1 and 470-2 of data 470 (e.g., 0110 and 0110, which correspond to decimal numerals 6 and 6) to obtain a single one by four block of data 472 (e.g., 0011, which corresponds to decimal numeral 12). As such, data 472 can be stored in four columns and one row of memory cells, as illustrated in FIG. 4. Data 472 can be a horizontal representation of the sum of the initial (e.g., input) columns of data 462.

Figure 5A:
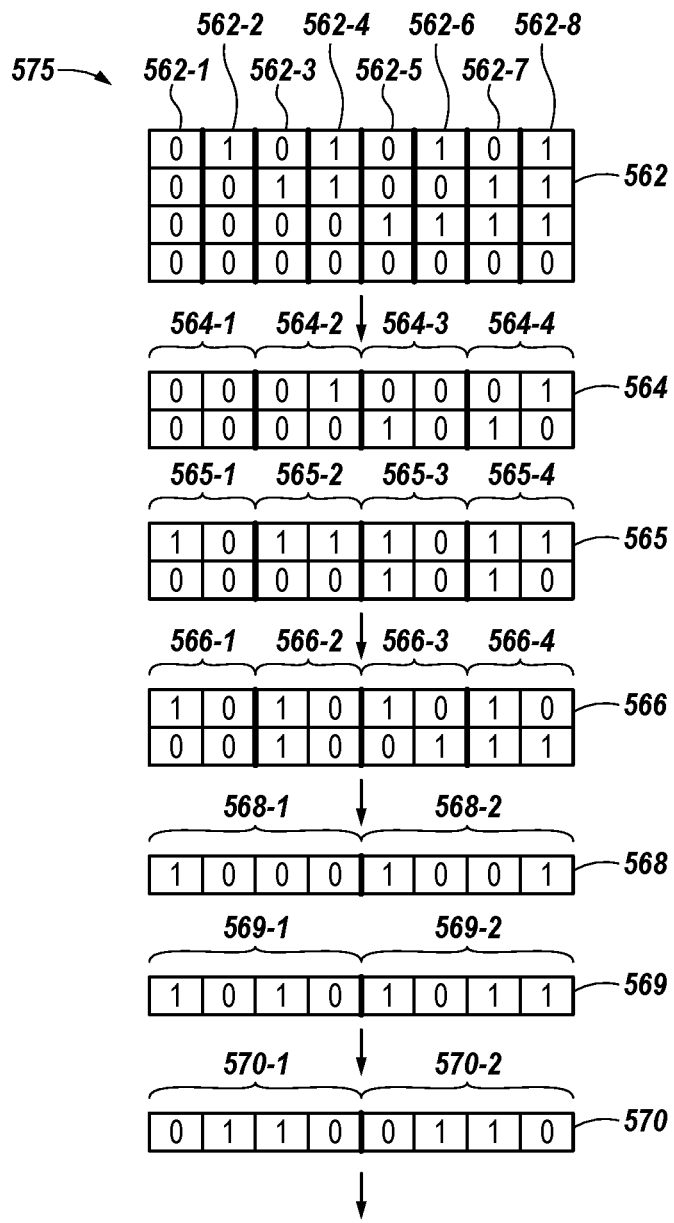
FIGS. 5A-5B illustrate an example of a prefix sum operation computed in accordance with a number of embodiments of the present disclosure.
Figure 5B:
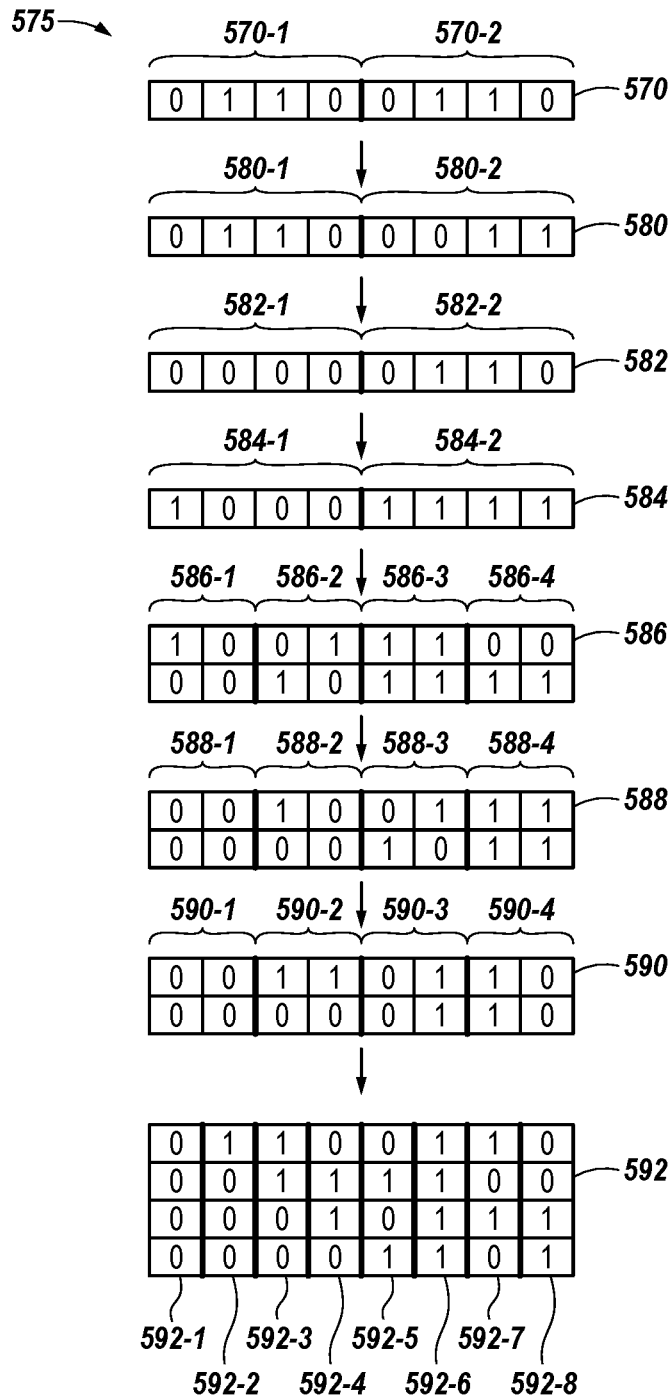

FIGS. 5A-5B illustrates an example of a prefix sum operation 575 computed in accordance with a number of embodiments of the present disclosure. The prefix sum operation 575 illustrated in FIGS. 5A-5B can be performed by sensing circuitry 350 (e.g., sense amplifier 306 and compute component 331) previously described in connection with FIG. 3. Prefix sum operation 575 can be computed on data 562 illustrated in FIG. 4. Data 562 can be analogous to data 462 previously described in connection with FIG. 4. The example illustrated in FIGS. 5A-5B lays out data LSB to MSB in normal reading order (e.g., left-to-right, then top-to-bottom). Further, the indexing illustrated in FIG. 4 is one-based.

As shown in FIG. 5A, prefix sum operation 575 can include splitting data 562 into even indexed elements 564 and odd indexed elements 565, copying even and odd indexed elements 564 and 565 into two by two elements (e.g., blocks) 564-1, . . . 565-4 and 565-1, . . . 565-4, respectively, and performing an addition operation on the corresponding two by two blocks of even indexed elements 564 and odd indexed elements 565 to obtain data 566, in a manner analogous to that of reduction operation 460 previously described in connection with FIG. 4. As shown in FIG. 5A, prefix sum operation 575 can include splitting data 566 into even indexed elements 568 and odd indexed elements 569, copying even and odd indexed elements 568 and 569 into one by four blocks 568-1 and 568-2, and 569-1 and 569-2, respectively, and performing an addition operation on the corresponding one by four blocks of even indexed elements 568 and odd indexed elements 569 to obtain data 570, in a manner analogous to that of the second iteration of operation 460 previously described in connection with FIG. 4.

As shown in FIG. 5B, prefix sum operation 575 can include obtaining data 580 from data 570. As shown in FIG. 5A, block 580-1 of data 580 (e.g., 0110, which corresponds to decimal numeral 6) is the same as the block 570-1 of data 570, and block 580-2 of data 580 (e.g., 0011, which corresponds to decimal numeral 12) is the sum of blocks 570-1 and 570-2 of data 570.

As shown in FIG. 5B, prefix sum operation 575 can include shifting block 580-1 of data 580 one block to the right such that it becomes block 582-2 of data 582, and filling an identity element (e.g., 0000, which corresponds to decimal numeral 0) into block 582-1 of data 582. Prefix sum operation 575 can then include performing an addition operation on the corresponding one by four blocks of data 582 and even indexed elements 568 to obtain data 584. For example, block 582-1 of data 582 (e.g., 0000) and block 568-1 of even indexed elements 568 (e.g., 1000) can be added (e.g., combined) to obtain block 584-1 of data 584 (e.g., 1000, which corresponds to decimal numeral 1). Similarly, blocks 582-2 and 568-2 of data 582 and even data 568 (e.g., 0110 and 1001, respectively) can be added (e.g., combined) to obtain block 584-2 of data 584 (e.g., 1111, which corresponds to decimal numeral 15), as illustrated in FIG. 5B.

As shown in FIG. 5B, prefix sum operation 575 can include packing data 580 and data 584 into two by two blocks 586-1, . . . 586-4 of data 586. An example of code (e.g., pseudocode representing executable instructions) for performing such a packing operation will be further described herein. Blocks 586-1 and 586-3 of data 586 can correspond to the decimal numerals of data 584, and blocks 586-2 and 586-4 of data 586 can correspond to the decimal numerals of data 580. For example, block 586-1 of data 586 (e.g., 1000) can correspond to decimal numeral 1, block 586-2 of data 586 (e.g., 0110) can correspond to decimal numeral 6, block 586-3 of data 586 (e.g., 1111) can correspond to decimal numeral 15, and block 586-4 of data 586 (e.g., 0011) can correspond to decimal numeral 12. As such, data 586 can be stored in eight columns and two rows of memory cells, as illustrated in FIG. 5B.

As shown in FIG. 5B, prefix sum operation 575 can include shifting each two by two block 586-1, . . . 586-4 of data 586 one block to the right to obtain data 588 (e.g., shifting block 586-1 of data 586 one block to the right such that it becomes block 588-2 of data 588, shifting block 586-2 of data 586 one block to the right such that it becomes block 588-3 of data 588, and shifting block 586-3 of data 586 one block to the right such that it becomes block 588-4 of data 588), and filling an identity element (e.g., 0000, which corresponds to decimal numeral 0) into block 588-1 of data 588. Prefix sum operation 575 can then include performing an addition operation on the corresponding two by two blocks of data 588 and even indexed elements 564 to obtain data 590. For example, block 588-1 of data 588 (e.g., 0000) and the block 564-1 of even indexed elements 564 (e.g., 0000) can be added (e.g., combined) to obtain block 590-1 of data 590 (e.g., 0000, which corresponds to decimal numeral 0). Similarly, blocks 588-2 and 564-2 of data 588 and even indexed elements 564, respectively (e.g., 1000 and 0100, respectively) can be added to obtain block 590-2 of data 590 (e.g., 1100, which corresponds to decimal numeral 3), blocks 588-3 and 564-3 of data 588 and even indexed elements 564, respectively (e.g., 0110 and 0010, respectively) can be added to obtain block 590-3 of data 590 (e.g., 0101, which corresponds to decimal numeral 10), and blocks 588-4 and 564-4 of data 588 and even indexed elements 564 (e.g., 1111 and 0110, respectively) can be added to obtain block 590-4 of data 590 (e.g., 1010, which corresponds to decimal numeral 5), as illustrated in FIG. 5B.

As shown in FIG. 5B, prefix sum operation 575 can then include packing data 586 and data 590 into four by one blocks 592-1, 592-2, ... 592-8 of data 592. An example of code (e.g., pseudocode) for performing such a packing operation will be further described herein. The odd blocks (e.g., 592-1, 592-3, 592-5, and 592-7) of data 592 can correspond to the decimal numerals of data 590, and the even blocks (e.g., 592-2, 592-4, 592-6, and 592-8) of data 592 can correspond to the decimal numerals of data 586. For example, block 592-1 of data 592 (e.g., 0000) can correspond to decimal numeral 0, block 592-2 of data 592 (e.g., 1000) can correspond to decimal numeral 1, block 592-3 of data 592 (e.g., 1100) can correspond to decimal numeral 3, block 592-4 of data 592 (e.g., 0110) can correspond to decimal numeral 6, etc. As such, data 592 can be stored in eight columns and four rows of memory cells, as illustrated in FIG. 5B.

The below example of code (e.g., pseudocode representing executable instructions) can be used for performing additions of block-format data as described in connection with FIGS. 4 and/or 5. In the below example, it is assumed that the data is a set of blocks of size vsize by hsize. To add row sequences a and b:

1. Create two new arrays gen and prop, each of the same size as a and b.
2. Set gen[i] to the bitwise AND of a[i] and b[i] for each i in 0.vsize−1.
3. Set prop[i] to the bitwise XOR of a[i] and b[i] for each i in 0.vsize−1.
4. For each power of 2 from 1 to the greatest power of 2 less than or equal to hsize*vsize:
   a. Call that value "shift".
   b. Shift each element of gen right by shift to get gen_shifted (see below for pseudocode for this).
   c. Shift each element of prop right by shift to get prop_shifted.
   d. Bitwise AND gen_shifted[i] and prop[i] for each i in 0.vsize−1, and OR that with gen[i] to get the new value of gen[i].
   e. Bitwise AND prop_shifted[i] and prop[i] to produce a new value of prop[i].
5. Shift each element of gen right by 1.
6. Bitwise XOR a[i], b[i], and the shifted value of gen[i] to get row i of the output for i=0.vsize−1.

In the above example, shifting a block means to shift its numerical value (e.g., sequence of bits) right, which means the bits need to wrap between rows. To shift a vsize by hsize block named "a" right by n bits:

1. Create an array "out" of the same size as a, initializing it to zero.
2. Create a mask with (n mod hsize) 0's and hsize−(n mod hsize) 1's, repeating that pattern for the width of the row.
3. If n mod hsize is not equal to 0, repeat the following for each i from 0.vsize−1:
   a. Shift a[i] (a single row) right by (n mod hsize), then AND it with the mask, storing that as a temporary.
   b. Bitwise OR that result and out[i] to produce a new value for out[i].
   c. If i is not vsize−1:
      i. Shift a[i] right by hsize−(n mod hsize), bitwise AND with the complement of the mask, and store that in a temporary variable.
      ii. Bitwise OR that value with out[i+1] to produce a new value of out[i+1].
4. Rotate the rows of out up by floor(n/hsize) so that row out[i+floor(n/hsize)] goes to row out[i], wrapping as appropriate.

The below example of code (e.g., pseudocode) can be used for performing splitting and/or packing operations as described in connection with FIGS. 4 and/or 5. To transpose a 2×2 matrix (e.g., two rows) built of 1*hsize blocks:

1. Create a mask containing blocks of hsize ones and zeros alternating (for example, for length 16 and hsize 4, the mask is 1111000011110000) from LSB to MSB.
2. Bitwise AND both rows with the mask and its logical complement (NOT); this produces four rows as results: row0_and_mask, row1_and_mask, row0_and_not_mask, row1_and_not_mask.
3. Shift row1_and_mask right by hsize bits, then bitwise OR in row0_and_mask; this produces the first row of the result.
4. Shift row0_and_not_mask right by hsize bits, then bitwise OR in row1_and_not_mask; this produces the second row of the result.

Widening data from block size m×n to block size m/2×2n can use the above transpose example on adjacent pairs of rows from the input data (e.g., 0 and 1, 2 and 3, etc.) with hsize=n. Narrowing the data back down from m/2×2n to m×n can use hsize=n as well on corresponding rows of the input data being combined into the narrower format.

Figure 6A:
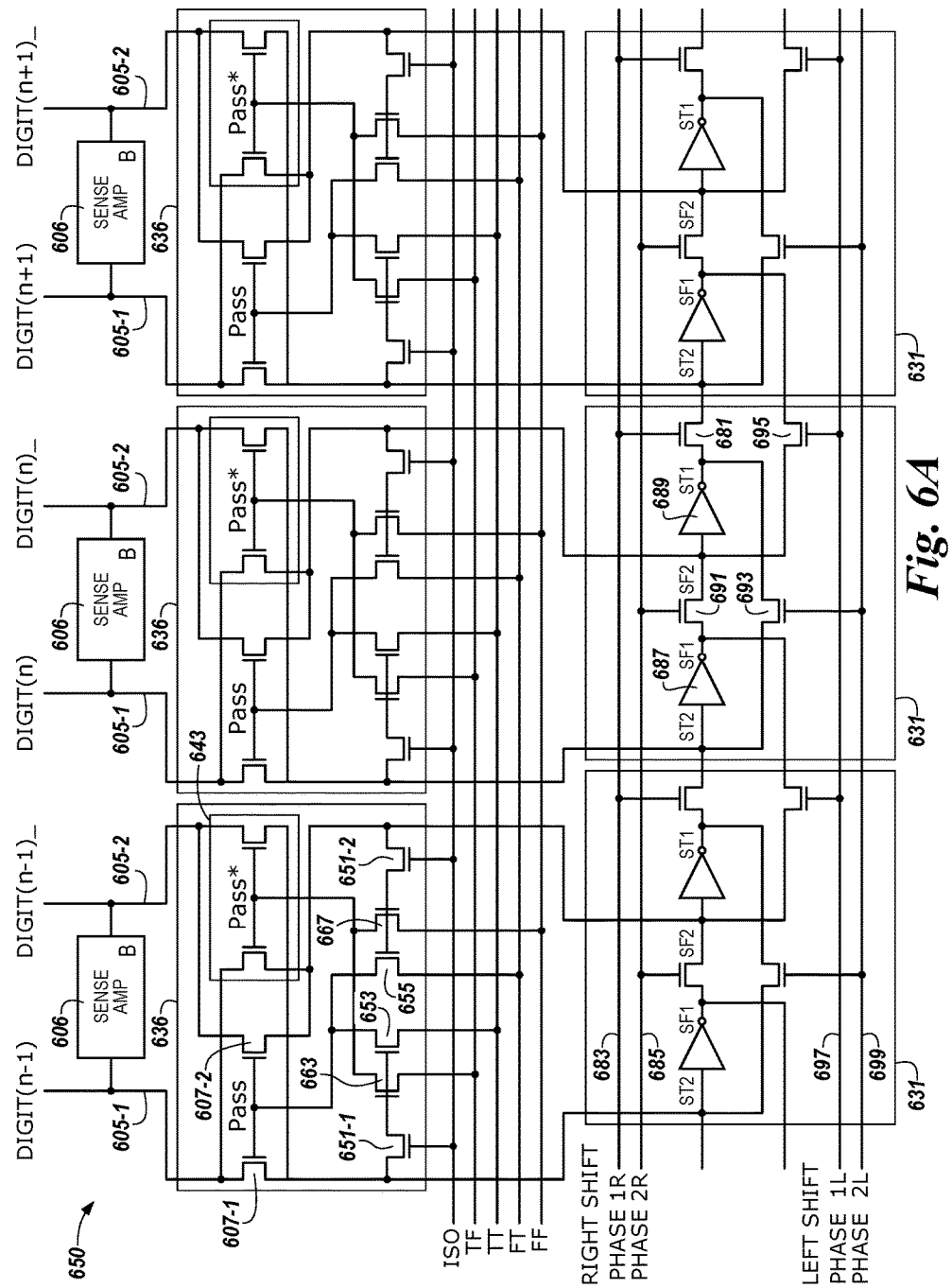
FIG. 6A is a schematic diagram illustrating processing circuitry in accordance with a number of embodiments of the present disclosure.

FIG. 6A is a schematic diagram illustrating processing (e.g., sensing) circuitry 650 in accordance with a number of embodiments of the present disclosure. Sensing circuitry 650 can be, for example, sensing circuitry 150 and/or 250 previously described in connection with FIGS. 1 and 2, respectively, and can be capable of implementing a number of logical operations in accordance with a number of embodiments of the present disclosure.

FIG. 6A shows a number of sense amplifiers 606 coupled to respective pairs of complementary sense (e.g., data) lines 605-1 and 605-2, and a corresponding number of compute components 631 coupled to the sense amplifiers 606 via pass transistors (e.g., gates) 607-1 and 607-2. The sensing circuitry shown in FIG. 6A includes logical operation selection logic 636, which can be operated as described further below.

Although not shown, memory cells can coupled to the pairs of complementary sense lines 605-1 and 605-2 (e.g., columns). The memory cells can be, for example, the memory cells of memory array 230 previously described in connection with FIG. 2, and can be coupled to the pairs of complementary sense lines 605-1 and 605-2 in a manner analogous to that previously described in connection with FIG. 2.

As shown in FIG. 6A, the sensing circuitry 650 can comprise a sense amplifier 606, a compute component 631, and logical operation selection logic 636 corresponding to respective columns of memory cells (e.g., coupled to respective pairs of complementary data lines). The sense amplifier 606 can comprise, for example, a cross coupled latch, which can be referred to herein as a primary latch.

In the example illustrated in FIG. 6A, the circuitry corresponding to compute components 631 is configured as a loadable shift register. For instance, each compute component 631 comprises a latch, which may be referred to herein as a secondary latch, and an additional number of transistors operable to transfer (e.g., shift) data values right and/or left (e.g., to a latch of an adjacent compute component 631). As described further herein, in a number of embodiments, the latch of the compute component 631 can serve as an accumulator. As such, the compute component 631 can operate as and/or may be referred to herein as an accumulator.

The gates of the pass gates 607-1 and 607-2 can be controlled by a logical operation selection logic signal, Pass. For example, an output of the logical operation selection logic 636 can be coupled to the gates of the pass gates 607-1 and 607-2, as shown in FIG. 6A.

The sensing circuitry 650 shown in FIG. 6A also shows logical operation selection logic 636 coupled to a number of logic selection control input control lines, including ISO, TF, TT, FT, and FF. Selection of a logical operation from a plurality of logical operations can be determined from the condition of logic selection control signals on the logic selection control input control lines, as well as the data values present on the pairs of complementary sense lines 605-1 and 605-2 when the isolation transistors (e.g., 651-1 and 651-2) are enabled via the ISO control signal being asserted.

According to various embodiments, the logical operation selection logic 636 can include four logic selection transistors: logic selection transistor 663 coupled between the gates of the swap transistors 643 and a TF signal control line, logic selection transistor 653 coupled between the gates of the pass gates 607-1 and 607-2 and a TT signal control line, logic selection transistor 655 coupled between the gates of the pass gates 607-1 and 607-2 and a FT signal control line, and logic selection transistor 667 coupled between the gates of the swap transistors 643 and a FF signal control line. Gates of logic selection transistors 663 and 653 are coupled to the true sense line through isolation transistor 651-1 (having a gate coupled to an ISO signal control line). Gates of logic selection transistors 667 and 655 are coupled to the complementary sense line through isolation transistor 651-2 (also having a gate coupled to an ISO signal control line).

Data values present on the pair of complementary sense lines 605-1 and 605-2 can be loaded into the compute component 631 via the pass gates 607-1 and 607-2. When the pass gates 607-1 and 607-2 are OPEN, data values on the pair of complementary sense lines 605-1 and 605-2 are passed to the compute component 631 and thereby loaded into the loadable shift register. The data values on the pair of complementary sense lines 605-1 and 605-2 can be the data value stored in the sense amplifier 606 when the sense amplifier is enabled (e.g., fired). The logical operation selection logic signal, Pass, is activated to OPEN (e.g., turn on) the pass gates 607-1 and 607-2.

The ISO, TF, TT, FT, and FF control signals can operate to select a logical operation to implement based on the data value ("B") in the sense amplifier 606 and the data value ("A") in the compute component 631 (e.g., as used herein, the data value stored in a latch of a sense amplifier is referred to as a "B" data value, and the data value stored in a latch of a compute component is referred to as an "A" data value). In particular, the ISO, TF, TT, FT, and FF control signals are configured to select the logical operation (e.g., function) to implement independent from the data value present on the pair of complementary sense lines 605-1 and 605-2 (although the result of the implemented logical operation can be dependent on the data value present on the pair of complementary sense lines 605-1 and 605-2. For example, the ISO, TF, TT, FT, and FF control signals select the logical operation to implement directly since the data value present on the pair of complementary sense lines 605-1 and 605-2 is not passed through logic to operate the gates of the pass gates 607-1 and 607-2.

Additionally, FIG. 6A shows swap transistors 643 configured to swap the orientation of the pair of complementary sense lines 605-1 and 605-2 between the sense amplifier 606 and the compute component 631. For instance, when the swap transistors 643 are OPEN (e.g., turned on), data values on the pair of complementary sense lines 605-1 and 605-2 on the sense amplifier 606 side of the swap transistors 643 are oppositely-coupled to the pair of complementary sense lines 605-1 and 605-2 on the compute component 631 side of the swap transistors 643, and thereby loaded into the loadable shift register of the compute component 631 in a complementary manner.

As an example, the logical operation selection logic signal Pass can be activated (e.g., high) to OPEN (e.g., turn on) the pass gates 607-1 and 607-2 when the ISO control signal line is activated and either the TT control signal is activated (e.g., high) with the data value on the true sense line being "1" or the FT control signal is activated (e.g., high) with the data value on the complement sense line being "1."

The data value on the true sense line being a "1" OPENs logic selection transistors 653 and 663. The data value on the complementary sense line being a "1" OPENs logic selection transistors 655 and 667. If the ISO control signal or either the respective TT/FT control signal or the data value on the corresponding sense line (e.g., sense line to which the gate of the particular logic selection transistor is coupled) is not high, then the pass gates 307-1 and 307-2 will not be OPENed by a particular logic selection transistor.

The logical operation selection logic signal Pass* can be activated (e.g., high) to OPEN (e.g., turn on) the swap transistors 643 when the ISO control signal line is activated and either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 643 will not be OPENed by a particular logic selection transistor.

The sensing circuitry 650 illustrated in FIG. 6A is configured to select one of a plurality of logical operations to implement directly from the four logic selection control signals (e.g., logical operation selection is not dependent on the data value present on the pair of complementary sense lines). Some combinations of the logic selection control signals can cause both the pass gates 607-1 and 607-2 and swap transistors 643 to be OPEN (e.g., conducting) at the same time, which shorts the pair of complementary sense lines 605-1 and 605-2 together. According to a number of embodiments of the present disclosure, the logical operations which can be implemented by the sensing circuitry illustrated in FIG. 6A can be the logical operations summarized in the logic tables shown in FIG. 6B.

Although not shown in FIG. 6A, each column of memory cells can be coupled to a column decode line that can be activated to transfer, via a local I/O line, a data value from a corresponding sense amplifier 606 and/or compute component 631 to a control component external to the array such as an external processing resource (e.g., host processor and/or other functional unit circuitry). The column decode line can be coupled to a column decoder. However, as described herein, in a number of embodiments, data need not be transferred via such I/O lines to perform logical operations in accordance with embodiments of the present disclosure. In a number of embodiments, shift circuitry can be operated in conjunction with sense amplifiers 606 and compute components 631 to perform logical operations without transferring data to a control component external to the array, for instance. As used herein, transferring data, which may also be referred to as moving data is an inclusive term that can include, for example, copying data from a source location to a destination location and/or moving data from a source location to a destination location without necessarily maintaining a copy of the data at the source location.

As noted above, the compute components 631 can comprise a loadable shift register. In this example, each compute component 631 is coupled to a corresponding pair of complementary data lines 605-1/605-2, with a node ST2 being coupled to the particular data line (e.g., DIGIT(n)) communicating a "true" data value and with node SF2 being coupled to the corresponding complementary data line (e.g., DIGIT(n)_) communicating the complementary data value (e.g., "false" data value).

In this example, the loadable shift register comprises a first right-shift transistor 681 of a particular compute component 631 having a gate coupled to a first right-shift control line 683 (e.g., PHASE 1R), and a second right-shift transistor 691 of the particular compute component 631 having a gate coupled to a second right-shift control line 685 (e.g., PHASE 2R). Node ST2 of the particular control component is coupled to an input of a first inverter 687, whose output (e.g., node SF1) is coupled to a first source/drain region of transistor 691. The second source/drain region of transistor 691 is coupled to the input (e.g., node SF2) of a second inverter 689. The output (e.g., node ST1) of inverter 689 is coupled to a first source/drain region of transistor 681, and a second source/drain region of transistor 681 the particular compute component 631 is coupled to an input (e.g., node ST2) of a first inverter 687 of an adjacent compute component 631. The loadable shift register shown in FIG. 6A includes a first left-shift transistor 695 coupled between node SF2 of a particular compute component and node SF1 of an adjacent compute component 631. The loadable shift register shown in FIG. 6A also includes a second left-shift transistor 693 of a particular compute component 631 having a first source/drain region coupled to node ST2 and a second source/drain region coupled to node ST1. The gate of the first left-shift transistor 695 is coupled to a first left-shift control line 697 (e.g., PHASE 1L), and the gate of the second left-shift transistor 693 is coupled to a second left-shift control line 699 (e.g., PHASE 2L).

In operation, a data value on a pair of complementary data lines (e.g., 605-1/605-2) can be loaded into a corresponding compute component 631 (e.g., by operating logical operation selection logic as described above). As an example, a data value can be loaded into a compute component 631 via overwriting of the data value currently stored in the compute component 631 with the data value stored in the corresponding sense amplifier 606. Alternatively, a data value may be loaded into a compute component by deactivating the control lines 683, 685, 697, and 699.

Once a data value is loaded into a compute component 631, the "true" data value is separated from the complement data value by the first inverter 687. Shifting data to the right (e.g., to an adjacent compute component 631) can include alternating operation of the first right-shift transistor 681 and the second right-shift transistor 691, for example, via the PHASE 1R and PHASE 2R control signals being periodic signals that go high out of phase from one another (e.g., non-overlapping alternating square waves 180 out of phase). The transistor 693 can be turned on to latch the shifted data value.

An example of shifting data left via the shift register shown in FIG. 6A can include operating control signals 697 and 699 to move a data value one control component to the left through transistors 695 and 693. Data from node ST2 is inverted through inverter 687 to node SF1. Activation of control signal 697 causes the data from node SF1 to move left through transistor 695 to node SF2 of a left-adjacent compute component 631. Data from node SF2 is inverted through inverter 689 to node ST1. Subsequent activation of control signal 699 causes the data from node ST1 to move through transistor 693 left to node ST2, which completes a left shift by one compute component 631. Data can be "bubbled" to the left by repeating the left shift sequence multiple times. Data values can be latched (and prevented from being further shifted) by maintaining the control signal 699 activated.

Embodiments of the present disclosure are not limited to the shifting capability described in association with the compute components 631. For example, a number of embodiments and include shift circuitry in addition to and/or instead of the shift circuitry described in association with a loadable shift register.

The sensing circuitry in FIG. 6A can be operated in several modes to perform logical operations, including a first mode in which a result of the logical operation is initially stored in the sense amplifier 606, and a second mode in which a result of the logical operation is initially stored in the compute component 631. Additionally with respect to the first operating mode, sensing circuitry can be operated in both pre-sensing (e.g., sense amplifiers fired before logical operation control signal active) and post-sensing (e.g., sense amplifiers fired after logical operation control signal active) modes with a result of a logical operation being initially stored in the sense amplifier 606.

In a number of examples, the sense amplifier 606 and the compute component 631 can be in at least one of two states associated with the first mode and the second mode. As used herein, a state of a sense amplifier 606 and/or the compute component 631 describes a transfer of data between the sense amplifier 606 and/or the compute component 631. The state of the sense amplifier 606 and the compute component 631 can also be described as the state of a sensing component. The state of a sensing component can be based on whether the sense amplifier 606 is in an equilibration state or is storing a data value (e.g., logic "0" or logic "1"). For example, a sense amplifier can be configured to be in an initial state, wherein the initial state is one of an equilibration state and a data storage state. An equilibration state includes the sense amplifier 606 being in an equilibration state. A data storage state includes the sense amplifiers 606 storing a data value. As used herein, a data value can be referred to as a bit and/or a digit value. Data can be transferred from a compute component 631 to a sense amplifier 606 in response to enabling a pass gate (e.g., activating the PASS and/or PASS* control signals via the TF 663, TT 653, FT 655, and/or FF 667 control signals that are referred to herein as a logical operation selection logic) and the sense amplifier 606 being in a equilibration state. Data can be transferred from a sense amplifier 606 to a compute component 631 in response to enabling the pass gate (e.g., activating the PASS and/or PASS* control signals via the TF 663, TT 653, FT 655, and/or FF 667 control signals that are referred to herein as a logical operation selection logic) and the sense amplifier 606 being in a data storage state. The direction of the transfer of data between the sense amplifier 606 and the compute component 631 is determined by whether the sense amplifier 606 is in an equilibration state or stores a data value before the PASS and/or PASS* control signals are activated and by a particular operation selected via the logical operation selection logic (e.g., TF 663, TT 653, FT 655, and FF 667 control signals).

For example, if the sense amplifier 606 is equilibrated and the PASS and/or PASS* control signals are activated to provide a conduction path (e.g., electrical continuity) between the sense amplifier 606 and the compute component 631, then a data value stored in the compute component 631 can be transferred from the compute component 631 to the sense amplifier 606.

If the sense amplifier 606 is configured to store a first bit (e.g., first data value) and the PASS and/or PASS* control signals are activated to provide a conduction path between the sense amplifier 606 and the compute component 631, then a second bit (e.g., second data value) that is stored in the compute component 631 before the activation of the PASS and/or PASS* control signals can be replaced by the first bit and the sense amplifier 606 retains the first bit. Furthermore, a number of operations can be performed using the first bit and the second bit using the logical operation selection logic and the result of the operation can be stored in the compute component 631.

Using an equilibration signal to direct the transfer of data between the sense amplifier 606 and the compute component 631 can provide the ability to selectively perform an operation in sense amplifiers that are not equilibrated without performing the operation in sense amplifiers that are equilibrated. For example, a PASS and/or a PASS* control signal can be activated in a plurality of sensing components to move data between a first group of a plurality of sense amplifiers that are equilibrated and a first group of a plurality of compute components. The PASS and/or PASS* control signals can also be activated to move data between a second group of the plurality of sense amplifiers and a second group of the plurality of component components that are not equilibrated to selectively perform an operation in a second group of sense components while not performing the operation on a first group of sense components.

FIG. 6B is a logic table illustrating selectable logic operation results implemented by a sensing circuitry in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 606 and compute component 631. The four control signals, in conjunction with a particular data value present on the complementary sense lines, controls the state (conducting or not conducting) of the pass gates 607-1 and 607-2 and swap transistors 643, which in turn affects the data value in the compute component 631 and/or sense amplifier 606 before/after firing. The capability to selectably control the state of the swap transistors 643 facilitates implementing logical operations involving inverse data values (e.g., inverse operands and/or inverse result), among others.

Logic Table 601-1 illustrated in FIG. 6B shows the starting data value stored in the compute component 631 in FIG. 6A shown in column A at 615, and the starting data value stored in the sense amplifier 606 shown in column B at 618. The other 3 column headings in Logic Table 601-1 refer to the state of the pass gates 607-1 and 607-2, and the swap transistors 643, which can respectively be controlled to be OPEN (e.g., conducting/on) or CLOSED (e.g., not conducting/off) depending on the state of the four logic selection control signals (e.g., TF, TT, FT, and FF), in conjunction with a particular data value present on the pair of complementary sense lines 605-1 and 605-2 when the ISO control signal is asserted. The "Not Open" column corresponds to the pass gates 607-1 and 607-2 and the swap transistors 643 both being in a non-conducting condition, the "Open True" corresponds to the pass gates 607-1 and 607-2 being in a conducting condition, and the "Open Invert" corresponds to the swap transistors 643 being in a conducting condition. The configuration corresponding to the pass gates 607-1 and 607-2 and the swap transistors 643 both being in a conducting condition is not reflected in Logic Table 601-1 since this results in the sense lines being shorted together.

The logic tables illustrated in FIG. 6B reflect a result initially stored in the compute component 631 in FIG. 6A. Therefore, when the pass gates 607-1 and 607-2 are controlled to be CLOSED (e.g., not conducting), the result initially stored in the compute component 631 is the same as the starting data value in the compute component 631. However, since the sense sensing circuitry 650 is configured such that the sense amplifier 606 can overpower the compute component 631 as shown in the "Not Open" column 624 of the Logic Table 601-1, the result initially stored in the compute component 631 is the same as the starting data value in the sense amplifier 606 when the pass gates 607-1 and 607-2 are controlled to be OPEN (e.g., conducting) as shown in the "Open True" column 625 of the Logic Table 601-1. The compute component 631 can be inverted as shown in the "Open Invert" column 626 when the swap transistors 643 are in a conducting condition.

Via selective control of the state of the pass gates 607-1 and 607-2 and the swap transistors 643, each of the three columns of the upper portion of Logic Table 601-1 can be combined with each of the three columns of the lower portion of Logic Table 601-1 to provide 3×3=9 different result combinations, corresponding to nine different logical operations, as indicated by the various connecting paths shown at 627. The nine different selectable logical operations that can be implemented by the sensing circuitry 650 are summarized in Logic Table 601-2 illustrated in FIG. 6B.

The columns of Logic Table 601-2 illustrated in FIG. 6B show a heading 635 that includes the state of logic selection control signals. For example, the state of a first logic selection control signal is provided in row 628, the state of a second logic selection control signal is provided in row 629, the state of a third logic selection control signal is provided in row 632, and the state of a fourth logic selection control signal is provided in row 633. The particular logical operation corresponding to the results is summarized in row 634.

For example, the results for the values of FF, FT, TF, and TT of "0000" are summarized as "A" since the result (initially stored in the compute component after the sense amplifier fires) is the same as the starting value in the compute component. Other columns of results are similarly annotated in row 634, where "A*B" intends A AND B, "A+B" intends A OR B, and "AXB" intends A XOR B. By convention, a bar over a data value or a logical operation indicates an inverted value of the quantity shown under the bar. For example, AXB bar intends not A XOR B, which is also A XNOR B.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   processing circuitry configured to compute at least one of a reduction operation and a prefix sum operation on data stored in a group of memory cells;
   wherein the processing circuitry is on layout pitch with sense lines of the group of memory cells.

2. The apparatus of claim 1, wherein the reduction operation includes:
   splitting the data into a plurality of elements;
   copying each of the plurality of elements into elements that are wider than before being copied; and
   performing a logical operation on each of the copied elements.

3. The apparatus of claim 2, wherein each of the copied elements are twice as wide as before being copied.

4. The apparatus of claim 2, wherein each of the copied elements are half as tall as before being copied.

5. The apparatus of claim 2, wherein the logical operation is an addition operation.

6. The apparatus of claim 2, wherein the logical operation is a multiplication operation.

7. A method of operating processing circuitry, comprising:
   computing at least one of a reduction operation and a prefix sum operation on data stored in a group of memory cells;
   wherein the at least one of the reduction operation and the prefix sum operation is computed without transferring the data via an input/output (I/O) line external to the group of memory cells.

8. The method of claim 7, wherein:
   the group of memory cells are included in an array of memory cells; and
   the I/O line is external to the array of memory cells.

9. The method of claim 7, wherein the prefix sum operation includes:
   splitting the data into a plurality of elements;
   copying each of the plurality of elements into elements that are wider than before being copied; and
   performing a logical operation on each of the copied elements.

10. The method of claim 9, wherein splitting the data into a plurality of elements includes splitting the data into even and odd indexed elements.

11. The method of claim 10, wherein the logical operation combines the even and odd indexed elements.

12. The method of claim 9, wherein the prefix sum operation includes:
    shifting an output of the logical operation;
    performing an additional logical operation on the shifted output and one of the copied elements; and
    packing an output of the additional logical operation into elements that are less wide than before the additional logical operation.

13. The method of claim 7, wherein the method includes storing a result of the at least one of the reduction operation and the prefix sum operation in the group of memory cells without transferring the data via the I/O line.

14. The method of claim 7, wherein the method includes outputting a result of the at least one of the reduction operation and the prefix sum operation to external hardware or an external register via the I/O line.

15. The method of claim 7, wherein the method includes computing the at least one of the reduction operation and the prefix sum operation using a sense amplifier and a compute component of the processing circuitry.

16. An apparatus, comprising:
    processing circuitry configured to compute at least one of a reduction operation and a prefix sum operation on data stored in a group of memory cells;
    wherein the processing circuitry is configured to compute the at least one of the reduction operation and the prefix sum operation without transferring the data via a bus external to the group of memory cells.

17. The apparatus of claim 16, wherein:
    the apparatus includes an array of memory cells that includes the group of memory cells; and
    the bus is external to the array of memory cells.

18. The apparatus of claim 16, wherein the processing circuitry comprises sensing circuitry.

19. The apparatus of claim 16, wherein the processing circuitry is configured to store a result of the at least one of the reduction operation and the prefix sum operation in the group of memory cells without transferring the data via the bus.

20. The apparatus of claim 16, wherein the prefix sum operation is a forward prefix sum operation or a backward prefix sum operation.

* * * * *